US008878205B2

(12) United States Patent
Greenwood (10) Patent No.: US 8,878,205 B2
(45) Date of Patent: *Nov. 4, 2014

(54) LIGHT EMITTING DIODE WAFER-LEVEL PACKAGE WITH SELF-ALIGNING FEATURES

(71) Applicant: Micron Technology, Inc., Boise, ID (US)

(72) Inventor: Jonathon G. Greenwood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/894,189

(22) Filed: May 14, 2013

(65) Prior Publication Data

US 2013/0248897 A1 Sep. 26, 2013

Related U.S. Application Data

(63) Continuation of application No. 12/721,016, filed on Mar. 10, 2010, now Pat. No. 8,441,020.

(51) Int. Cl.
*H01L 33/00* (2010.01)
*H01L 33/48* (2010.01)
*H01L 33/64* (2010.01)

(52) U.S. Cl.
CPC ............... *H01L 33/48* (2013.01); *H01L 33/641* (2013.01); *H01L 2933/0066* (2013.01); *H01L 33/0079* (2013.01); *H01L 33/647* (2013.01)
USPC .......... 257/88; 257/91; 257/E33.005; 438/28; 438/15; 438/29

(58) Field of Classification Search
USPC ................ 257/88, 91, 94, E33.005, E33.067, 257/E33.066, 797, 723; 438/15, 28, 29
See application file for complete search history.

(56) References Cited

U.S. PATENT DOCUMENTS 5,259,054 A 11/1993 Benzoni et al.
5,358,880 A 10/1994 Lebby et al.
(Continued)

FOREIGN PATENT DOCUMENTS

JP 2007042781 A 2/2007
JP 03137072 U 11/2007
(Continued)

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.

(Continued)

*Primary Examiner* — Roy Potter
(74) *Attorney, Agent, or Firm* — Perkins Coie LLP (57) ABSTRACT

Several embodiments of light emitting diode packaging configurations including a substrate with a cavity are disclosed herein. A patterned wafer has a plurality of individual LED attachment sites, and an alignment wafer has a plurality of individual cavities. The patterned wafer and the alignment wafer are superimposed with the LED attachment sites corresponding generally to the cavities of the alignment wafer. At least one LED is placed in the cavities using the cavity to align the LED relative to the patterned wafer. The LED is electrically connected to contacts on the patterned wafer, and a phosphor layer is formed in the cavity to cover at least a part of the LED.

21 Claims, 7 Drawing Sheets

(56) References Cited

U.S. PATENT DOCUMENTS

| | | | |
|---|---|---|---|
| 5,472,886 A | 12/1995 | Dautartas et al. | |
| 6,521,914 B2 | 2/2003 | Krames et al. | |
| 6,864,570 B2 | 3/2005 | Smith | |
| 7,875,533 B2 | 1/2011 | Epler et al. | |
| 7,977,686 B2 | 7/2011 | Ibbetson et al. | |
| 8,441,020 B2 * | 5/2013 | Greenwood | 257/88 |
| 2005/0237747 A1 | 10/2005 | Shimizu et al. | |
| 2006/0006404 A1 | 1/2006 | Ibbetson et al. | |
| 2006/0147746 A1 | 7/2006 | Wakako et al. | |
| 2008/0142831 A1 | 6/2008 | Su | |
| 2008/0149962 A1 | 6/2008 | Kim et al. | |
| 2009/0085050 A1 | 4/2009 | Guo et al. | |
| 2009/0095969 A1 | 4/2009 | Kotani et al. | |
| 2009/0108282 A1 | 4/2009 | Matsuda et al. | |
| 2011/0220925 A1 | 9/2011 | Greenwood | |

FOREIGN PATENT DOCUMENTS

| | | |
|---|---|---|
| JP | 2008098296 A | 4/2008 |
| JP | 2010021507 A | 1/2010 |

OTHER PUBLICATIONS

International Search Report and Written Opinion issued Nov. 25, 2011 in International Application No. PCT/US2011/027491, 7 pages.

Notice of Rejection Grounds issued Dec. 3, 2013 in Japan Application No. 2012-557160, 5 pages.

* cited by examiner

LIGHT EMITTING DIODE WAFER-LEVEL PACKAGE WITH SELF-ALIGNING FEATURES

CROSS-REFERENCE TO RELATED APPLICATION

This application is a continuation of U.S. application Ser. No. 12/721,016 filed Mar. 10, 2010, now U.S. Pat. No. 8,441, 020, which is incorporated herein by reference in its entirety.

TECHNICAL FIELD

The present disclosure is related to solid state lighting (SSL) devices and associated methods of operation. In particular, the present disclosure is related to light emitting diodes (LEDs) and associated methods of packaging.

BACKGROUND

Mobile phones, personal digital assistants (PDAs), digital cameras, MP3 players, and other portable electronic devices utilize SSL devices (e.g., white light LEDs) for background illumination. However, true white light LEDs are not available because LEDs typically only emit light at one particular wavelength. For human eyes to perceive the color white, a mixture of wavelengths is needed.

Figure 1A:
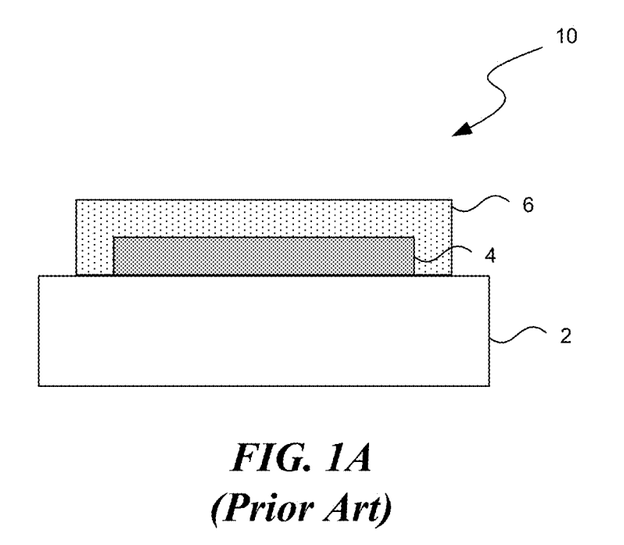
FIG. 1A is a schematic cross-sectional diagram of an LED device in accordance with the prior art.
Figure 1B:
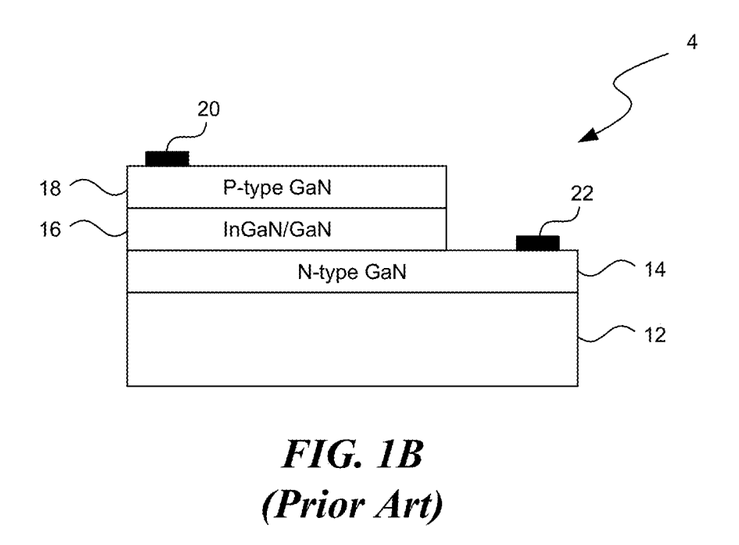
FIG. 1B is a schematic cross-sectional diagram of an LED device in accordance with the prior art.

One conventional technique for emulating white light with LEDs includes depositing a converter material (e.g., a phosphor) on a light emitting material. For example, as shown in FIG. 1A, a conventional LED device 10 includes a support 2 carrying an LED die 4 and a converter material 6 deposited on the LED die 4. The LED die 4 can include one or more light emitting components. For example, as shown in FIG. 1B, the LED die 4 can include a silicon substrate 12, an N-type gallium nitride (GaN) material 14, an indium gallium nitride (InGaN) material 16 (and/or GaN multiple quantum wells), and a P-type GaN material 18 on one another in series. The LED die 4 can also include a first contact 20 on the P-type GaN material 18 and a second contact 22 on the N-type GaN material 14. Referring to both FIGS. 1A and 1B, in operation, the InGaN material 16 of the LED die 4 emits a blue light that stimulates the converter material 6 to emit a light (e.g., a yellow light) at a desired frequency. The combination of the blue and yellow emissions appears white to human eyes if matched appropriately.

Many processes manufacture LED devices from a semiconductor wafer, which includes many individual LED dies. The wafers are later cut to separate the LED dies, and then the individual LED dies are packaged. For example, the LED die 4 shown in FIG. 1B can be packaged by attaching the LED die 4 to the substrate 2 and wire bonding the first and second contacts 20 and 22 of the LED die 4 to contacts of the support 2. The converter material 6 is then deposited and a lens (not shown) can be formed on or attached to the converter material 6.

One drawback of such LED packages is that a separate dam or other structure is generally needed to contain the converter material 6. Another concern is that each LED die 4 is often mounted to a separate substrate 2, which is time consuming and requires more precise handling. Additionally, LEDs generally produce a significant amount of heat, and the different coefficients of thermal expansion between the LED die 4 and the substrate 2 can cause delamination or other damage to the packaged device.

DETAILED DESCRIPTION

Various embodiments of SSL devices and associated methods of packaging are described below. The term "LED" generally refers to a semiconductor diode that converts electrical energy into electromagnetic radiation in the visible, ultraviolet, infrared and/or other spectra. The term "phosphor" generally refers to a material that can continue emitting light after exposure to energized particles (e.g., electrons and/or photons). A person skilled in the relevant art will also understand that the technology may have additional embodiments and that the technology may be practiced without several of the details of the embodiments described below with reference to FIGS. 2-5.

Figure 2:
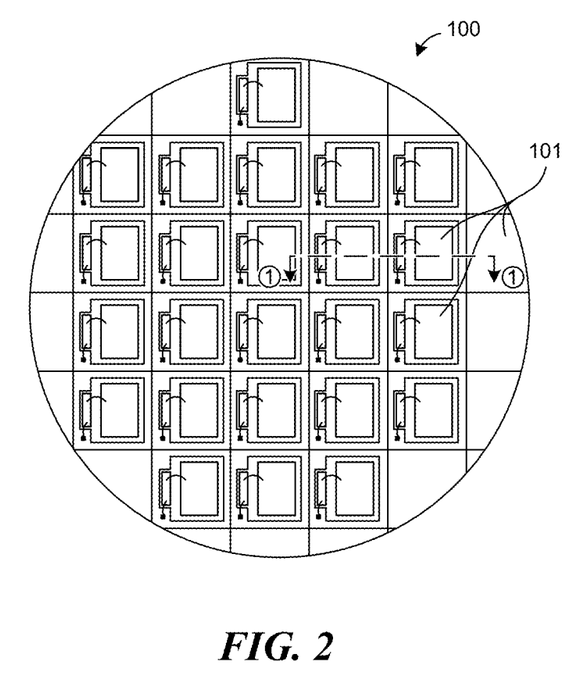
FIG. 2 is a partially schematic top view of a microelectronic LED substrate wafer in accordance with the new technology.
Figure 3A:
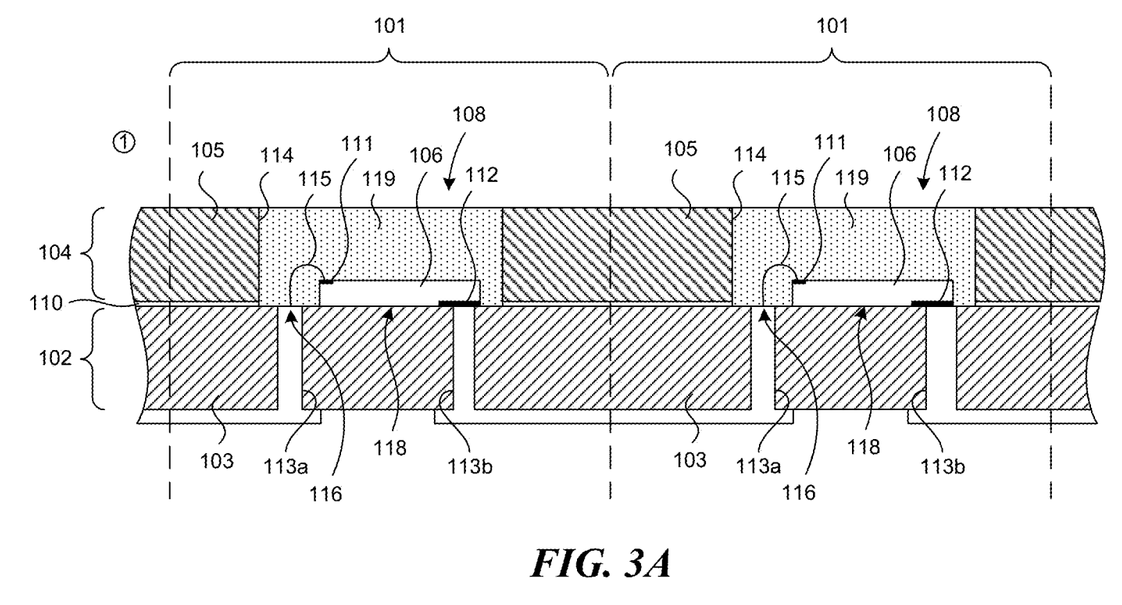
FIG. 3A is a partially schematic cross-sectional view of a substrate wafer LED package in accordance with the new technology.
Figure 4A:
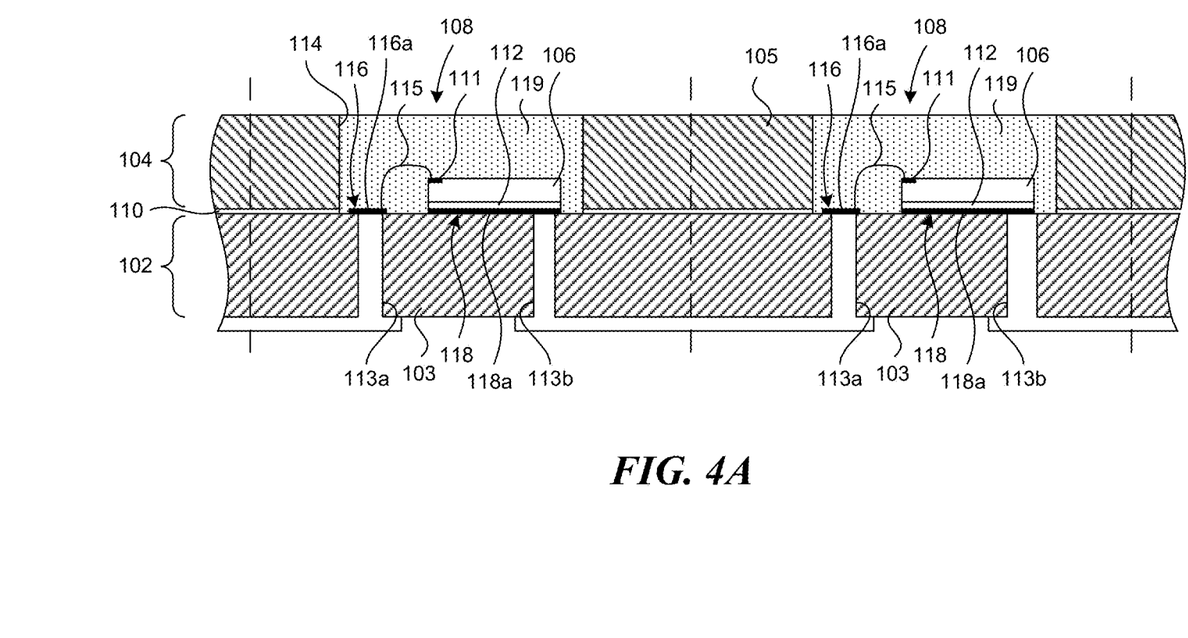
FIG. 4A is a partially schematic cross-sectional view of a substrate wafer LED package in accordance with the new technology.

FIG. 2 illustrates a wafer-level packaging assembly 100 having a plurality of packaged units 101 according to the new technology. The wafer-level packaging assembly 100 can be a standard size semiconductor wafer having a diameter of 150 mm, 200 mm, or 300 mm, and can contain several individual packaged units 101 that can be singulated from the wafer assembly 100 after completing certain manufacturing processes on the wafer assembly 100. FIGS. 3A and 4A are cross-section views taken along line 1-1 of in FIG. 2 of a few packaged units 101 according to various embodiments of the present technology.

FIG. 3A illustrates several embodiments of the packaging assembly 100, including a patterned substrate 102 and an alignment substrate 104 superimposed upon the patterned substrate 102. The patterned substrate 102 has several individual mounting units 103, and the alignment substrate 104 has several individual alignment units 105 that generally correspond to the mounting units 103. As explained below, each packaged unit 101 includes a mounting unit 103 and an alignment unit 105. The materials for the patterned substrate 102 and the alignment substrate 104 can have a generally similar, or identical coefficients of thermal expansion (CTE) such that when the substrates 102, 104 heat up or cool down, they expand or contract to approximately the same extent. This mitigates thermal stresses between the substrates 102, 104. The same is true for the packaged units 101 after singulating the packaging assembly 100—the mounting units 103 have approximately the same CTE as the alignment units 105. For a concise explanation, structures and process of the new technology are described with respect to only a few packaged units 101, but the processes are generally conducted at the wafer-level before singulating the packaged units 101 from each other.

Figure 3B:
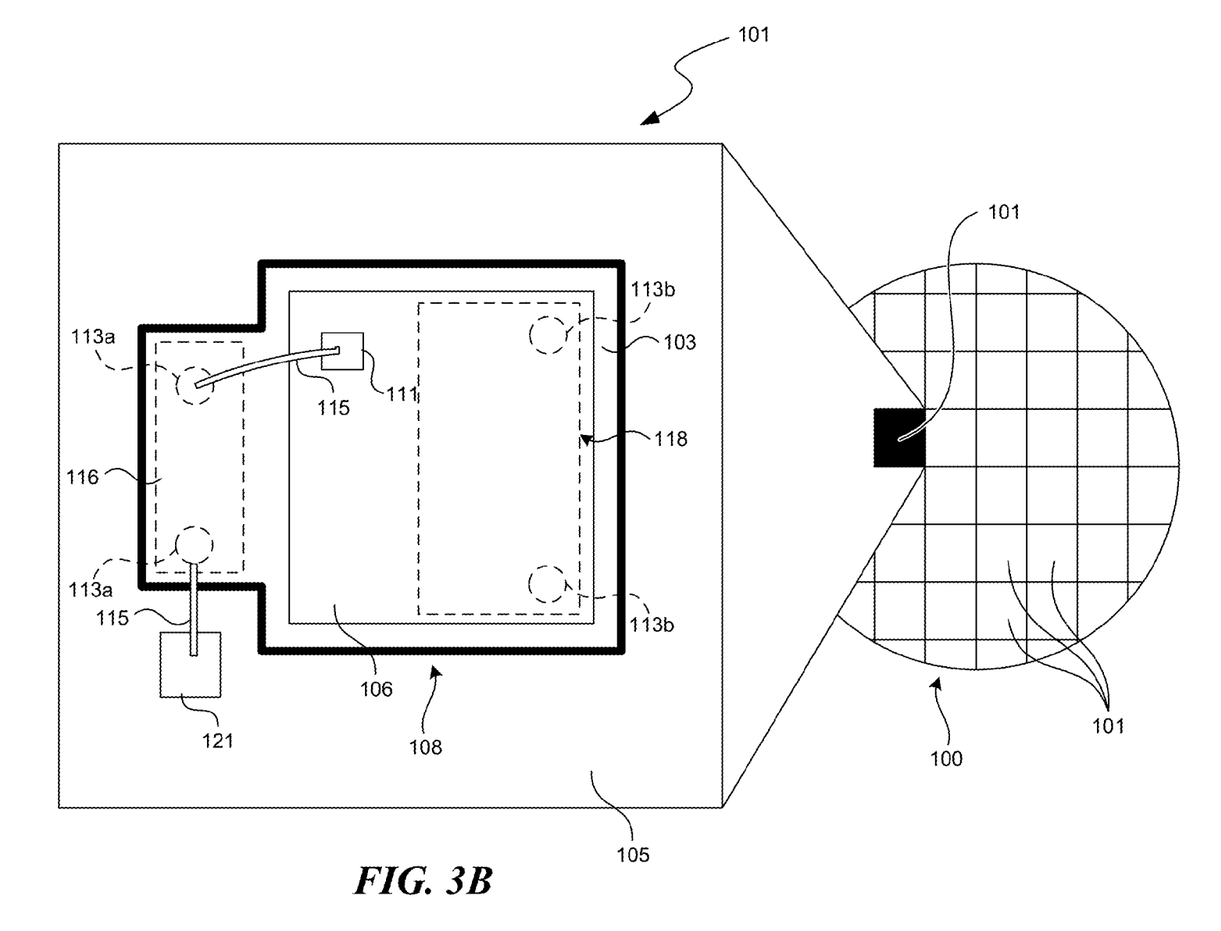
FIG. 3B is a partially schematic top view of an individually packaged LED device in accordance with the new technology.

The mounting units 103 can each include electrically conductive features, such as first and second vias 113a and 113b formed on and/or in the patterned substrate 102, an LED attachment site 118, and a wirebond region 116. In some embodiments, the wirebond region 116 and the LED attachment site 118 can be an upper portion of the vias 113a and 113b, respectively, and generally flush with a top surface of the mounting unit 103. The vias 113a, 113b can be made using known metallization processes for forming interconnects of copper, aluminum or other suitable materials. The wirebond region 116 can be separated from the LED attachment site 118 by a certain distance and electrically isolated from the LED attachment site 118 such that the first and second vias 113a, 113b are electrically isolated from each other. In some embodiments, the vias can be larger and/or more numerous than what is shown in FIG. 3B. Generally, the material from which the vias 113a, 113b are made conducts heat more efficiently than the material of the mounting unit 103. Using more and/or larger vias 113a, 113b, therefore, can improve the thermal efficiency of the package 100.

The individual packaged units 101 can further include an LED 106 at the LED attachment site 118. The LED 106 can be the same as the LED die 4 shown in FIG. 1B. In other embodiments the LED 106 can have a first contact 111 electrically coupled to the first via 113a by a wirebond 115 and a second contact 112 at the base of the LED 106 electrically coupled to the second via 113b by solder, gold (Au), conductive paste or other conductive bonding-type connection or other surface type connection. The first and second contacts 111 and 112 can be copper (Cu), aluminum (Al), tungsten (W), stainless steel, other suitable metals metal alloys, or other base metals with suitable final metals for final bonding and electrical connection. The first and second contacts 111 and 112 can also be made from other electrically conductive materials (e.g., SiC). In other embodiments, an N-type GaN material at the bottom of the LED 106 can be the second lead 112. The first lead 111 can be a cathodic lead and the second lead 112 can be an anodic lead, or vice-versa. The LED 106 can be configured to emit light in the visible spectrum (e.g., from about 565 nm to about 660 nm), in the infrared spectrum (e.g., from about 680 nm to about 970 nm), in the near infrared spectrum (e.g., from about 1050 nm to about 1550 nm), and/or in other suitable spectra.

Individual alignment units 105 can have a cavity 108 that corresponds generally to certain portions of mounting units 103. The cavity 108 can accommodate one or more individual LEDs 106 depending on whether each packaged unit 101 has a single LED 106 or multiple LEDs 106. In some embodiments, the cavity 108 has sidewalls 114 extending completely through the alignment wafer 104. The cavity 108 can have a circular shape, a square shape, or any other shape to accommodate one or more LEDs 106. The cavity 108 can also be shaped to accommodate the wirebond region 116 as well as the LED attachment site 118, or the cavity 108 can include two separate compartments to further separate the LED attachment site 118 from the wirebond region 116.

The packaging assembly 100 provides efficient packaging of LEDs because the sidewalls 114 of the cavities 108 can be used to guide the LEDs 106 in place on the patterned substrate 102. As described above, the second lead 112 of the LED 106 can be a conductive base structure of either a metallized layer or the N-type GaN material. Because the second lead 112 covers at least a portion of the second via 113b, the LED 106 can be surface-mounted within the cavity 108. Therefore, the LED 106 has a high positional tolerance relative to the second via 113b. In contrast to other configurations with very small leads that require precise, expensive, and time consuming positioning procedures, the LED 106 can be placed in the cavity 108 with little alignment requirements and at least one lead does not need to be wirebonded. In several embodiments, the assembly 100 is constructed such that if the LED 106 is sitting within the cavity 108 and contacting the patterned substrate 102, no further alignment is required.

The patterned substrate 102 and alignment substrate 104 can be attached to each other before or after mounting the LEDs 106 to the attachment sites 118, but in general the patterned and alignment substrates 102, 104 are bonded together before the LEDs 106 are mounted. The substrates 102, 104 are bonded together such that individual mounting units 103 are aligned with corresponding alignment units 105. The substrates 102, 104 can be bonded together using a bonding material 110 applied to one or both of the substrates 102, 104. The bonding material 110 can comprise a metal, such as copper, solder, gold or other materials. For example, a copper bonding material 110 can be pressed between the substrates 102, 104 at an elevated temperature to form a copper thermocompression bond. In other embodiments, the bonding material 110 is an adhesive such as a tape or paste which is pressed together to form the seal. In still additional embodiments the patterned substrate 102 can be bonded to the alignment substrate 104 using an anodic bond with no bonding material 110 between them. The anodic bond can be formed by clamping the substrates 102, 104 between two metal electrodes at an elevated temperature (e.g., approximately 400° C.). An electric potential can be applied between the electrodes creating an electrical field that penetrates the substrates 102, 104. To form an anodic bond, one of the patterned or alignment substrates 102, 104 is made from glass that contains sodium ions, and the other of the substrates is made from silicon. The electrical field displaces the sodium ions at the elevated temperature, and the sodium ions react with the silicon surface of the other substrate to form a solid chemical bond.

A converter material 119, such as phosphor embedded within a carrier material, can be deposited in the cavity 108 over at least a portion of the LED 106 without having to form a separate dam on the patterned substrate 102. The converter material 119 can have a composition that emits light at a desired wavelength under stimulation such that a combination of the emission from the LED 106 and the converter material 119 can emulate a white light. For example, in one embodiment, the converter material 119 can include a phosphor containing cerium(III)-doped yttrium aluminum garnet (YAG) at a particular concentration for emitting a range of colors from green to yellow and to red under photoluminescence. In other embodiments, the converter material 119 can include neodymium-doped YAG, neodymium-chromium double-doped YAG, erbium-doped YAG, ytterbium-doped YAG, neodymium-cerium double-doped YAG, holmium-chromium-thulium triple-doped YAG, thulium-doped YAG, chromium(IV)-doped YAG, dysprosium-doped YAG, samarium-doped YAG, terbium-doped YAG, and/or other suitable phosphor compositions. When light and/or energized particles from the LED 106 irradiates the converter material 119, the phosphor is energized and emits light with desired characteristics. A lens (not shown) can also be constructed over at least a portion of the converter material 119 and/or the LED 106 to focus or otherwise alter the light. The converter material 119 and/or the lens can be formed at the wafer-level before singulating the packaged units 101 from each other.

FIG. 3B shows an enlarged, top view of a single packaged unit 101 in relation to the wafer-level assembly 100. Features of the packaged unit 101 described here are generally similar to the packaged unit 101 shown and described above with respect to FIG. 3A. Like numerals accordingly refer to like structures in FIGS. 3A and 3B. A portion of the mounting unit 103 is visible through the cavity 108 underneath the alignment unit 105. The LED 106 is shown in the cavity 108 over the LED attachment site 118 and over the second vias 113b (shown in phantom) with the second contact 112 (FIG. 3A) connected to the second vias 113b. The packaged unit 101 can include an electrostatic dissipation (ESD) chip 121 near the LED 106 to dissipate static electricity generated in and around the LED 106. The alignment unit 105 can have a pocket or slot for the ESD chip 121, or it can be integrated into the mounting unit 103 or molded into the alignment unit 105. The ESD chip 121 can be connected to the LED 106 or to the first vias 113a in the wirebond region 116 through wirebonds 115.

FIG. 4A illustrates a partially schematic cross-sectional view of a packaged LED unit 101 along section line 1-1 of FIG. 2 in further embodiments of the new technology. Many components of the packaged unit 101 are generally similar to features described above with respect to FIGS. 2, 3A and 3B; like reference numerals accordingly refer to like features. The wirebond region 116 in this embodiment includes a first conductive material 116a formed on the first vias 113a. The wirebond 115 can be connected to the wirebond region 116 through the first conductive material 116a. The LED attachment site 118 can include a second conductive material 118a formed on the second vias 113b. One or more of the first and second conductive materials can include a metallized structure of copper (Cu), aluminum (Al), gold (Au), silver (Ag), tungsten (W), or an alloy of these or different materials, or any other suitable conductive material. The first and second conductive materials 116a, 118a can be patterned or otherwise separated so they are electrically isolated from one another, and can serve as the anodic and cathodic LED lead, respectively, or vice-versa. The second conductive material 118a can be approximately the same size and shape as the LED 106, or it can be smaller or larger than the LED 106. Additionally, the bonding material 110, first conductive material 116a and second conductive material 118a can all be made from a common metal structure that is patterned to form these features. In several embodiments, the second contact 112 of the LED can be a conductive base layer extending over all or a substantial portion of a mounting surface of the LED 106. For example, the second contact 112 can include a N-type GaN material 14 (FIG. 1B) of the LED 106. The second contact 112 can also include a conductive substrate 12 (FIG. 1B) under the N-type GaN material 14. In either case, the LED 106 can be easily surface-mounted to the second conductive material 118a using sidewalls 114 of the cavity 108 and the relatively large area of the LED attachment site 118 to position the LED 106 on the mounting unit 103.

Figure 4B:
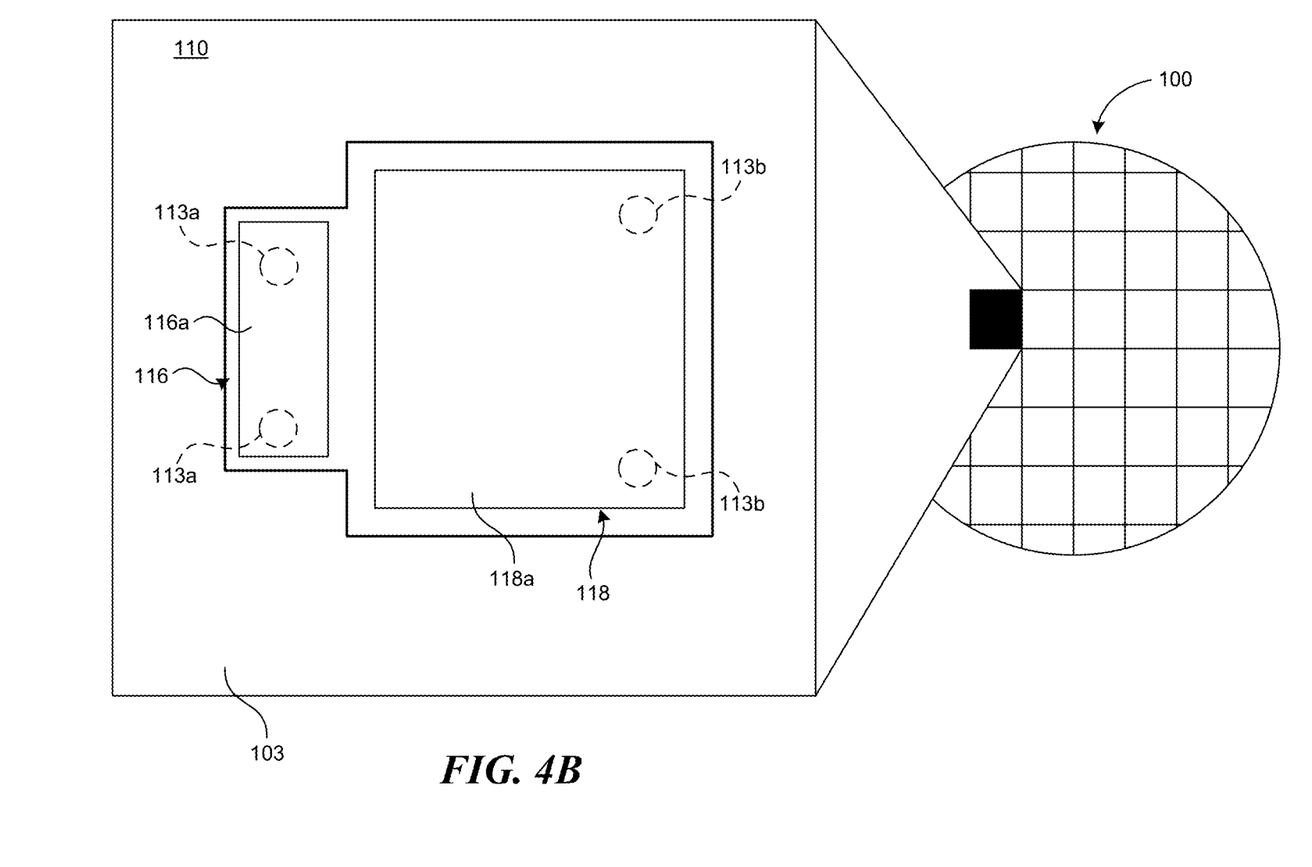
FIG. 4B is a partially schematic top view of a mounting unit in a substrate wafer LED package in accordance with the new technology.

FIG. 4B illustrates an enlarged, top view of an individual mounting unit 103 in relation to the wafer-level assembly 100 according to further embodiments of the new technology. The wirebond region 116 includes the first conductive material 116a over the first vias 113a (shown in phantom), and the LED attachment site 118 includes the second conductive material 118a over the second vias 113b (shown in phantom). The size and position of the wirebond region 116 and the LED attachment site 118 can vary to accommodate different LED configurations and package sizes. For example, a packaged unit 101 that includes multiple LEDs 106 can have a larger LED attachment site 118 that is configured according to the shape and layout of the LED 106 array. A bonding material 110 can be formed on a surface of the mounting unit 103 as described above. The bonding material 110 can be spaced apart from the LED attachment site 118 and the wirebond region 116 to avoid forming an unwanted electrical connection between the first conductive material 116a and the second conductive material 118a. In other embodiments, the bonding material 110 is formed on the alignment unit 105, or on both the mounting unit 103 and the alignment unit 105.

Figure 5:
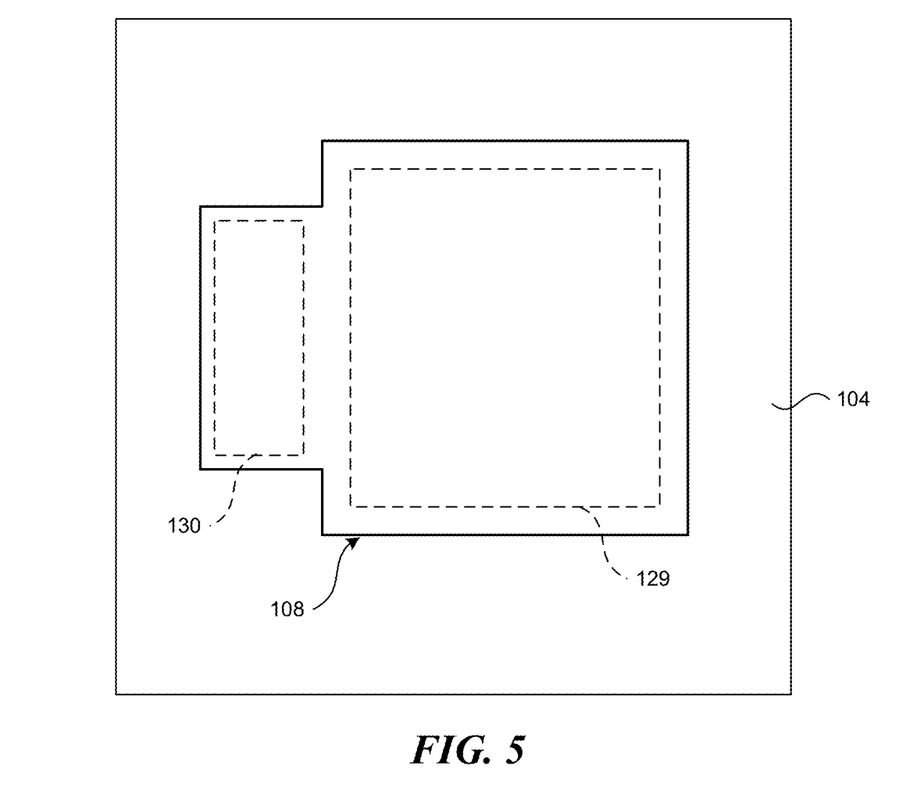
FIG. 5 is a partially schematic top view of an alignment unit in accordance with the new technology.

FIG. 5 illustrates a partially schematic top view of an individual alignment unit 105, such as after being singulated from the alignment substrate 104 according to the new technology. In some embodiments, the cavity 108 includes a larger cavity 129 that generally corresponds to the LED attachment site 118 on the mounting unit 103, and a smaller cavity 130 that generally corresponds to the contact region 116. The cavities 129, 130 can be formed into the alignment substrate 104 using an etching process or another suitable procedure. The size and shape of the cavities 129, 130 can be adjusted as needed. For example, a larger cavity 129 can be used in a package 100 that is to accommodate plural LEDs, or larger LEDs. In some embodiments, the large cavity 129 is separate from the small cavity 130. The size and shape of the cavities 129, 130 shown in FIG. 5 is for illustration purposes and is not limiting.

From the foregoing, it will be appreciated that specific embodiments of the invention have been described herein for purposes of illustration, but well-known structures and functions have not been shown or described in detail to avoid unnecessarily obscuring the description of the embodiments of the invention. Reference terms such as "top," "bottom," and "side" are used for purposes of explanation and refer primarily to certain perspectives shown in the Figures, and are not limiting. The structures and components described herein may have a different orientation in operation than that shown in a Figure. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Also, it will be appreciated that specific embodiments described above are for purposes of illustration and that various modifications may be made without deviating from the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. Accordingly, the present invention is not limited to the embodiments described above, which were provided for ease of understanding; rather, the invention includes any and all other embodiments defined by the claims.

I claim:

1. A wafer-level packaging assembly for light emitting diodes (LEDs), comprising:
   a patterned substrate comprising a plurality of individual mounting units, wherein individual mounting units comprise a wirebond region, a first via at the wirebond region, an LED attachment site, and a second via at the LED attachment site;
   an alignment substrate attached to the patterned substrate, the alignment substrate comprising a plurality of individual alignment units aligned with corresponding mounting units of the patterned substrate, and wherein the individual alignment units have a cavity exposing at least a portion of individual LED attachment sites and individual wirebond regions;

a plurality of LEDs, wherein at least one LED is positioned in each cavity, and wherein each LED has a first electric lead wirebonded to a corresponding first via in a wirebond region and a second electric lead surface mounted to a corresponding second via at an LED attachment site.

2. The packaging assembly of claim 1 wherein the patterned substrate and the alignment substrate have a generally similar coefficient of thermal expansion.

3. The packaging assembly of claim 1, further comprising a converter material over at least a portion of the LED in the cavity.

4. The packaging assembly of claim 3 wherein the converter material comprises phosphor.

5. The packaging assembly of claim 1, further comprising a bonding material between the patterned substrate and the alignment substrate.

6. The packaging assembly of claim 5 wherein the bonding material comprises a metallized layer.

7. The packaging assembly of claim 5 wherein the bonding material comprises an adhesive material.

8. The packaging assembly of claim 1 wherein the wirebond region comprises a first conductive material formed on the first via on a surface of the mounting unit and the LED attachment site comprises a second conductive material formed on the second vias on the surface of the mounting unit.

9. The packaging assembly of claim 8 wherein at least one of the first or second conductive materials comprises a metallized copper structure.

10. The packaging assembly of claim 1, further comprising an electrostatic dissipation (ESD) chip near the LED.

11. The packaging assembly of claim 1 wherein the second electric lead comprises a metallized layer on a base of the LED.

12. The packaging assembly of claim 1 wherein the second electric lead comprises an N-type GaN material at the base of the LED.

13. A method for manufacturing a package for a light emitting diode (LED), the method comprising:

attaching a patterned wafer to an alignment wafer such that LED attachment sites of the patterned wafer are generally aligned with corresponding cavities of the alignment wafer;

positioning a plurality of LEDs in the cavities at the LED attachment sites by using at least one surface of the cavities to align the LEDs with the LED attachment sites; and connecting the LEDs with wirebonding regions of the patterned wafer through wirebonds.

14. The method of claim 13, further comprising surface-mounting the LEDs to the LED attachment sites.

15. The method of claim 13, further comprising singulating the patterned wafer and the alignment wafer into a plurality of individual LED packages.

16. The method of claim 13 wherein the LEDs are electrically connected to the via through the LED attachment sites.

17. The method of claim 13 wherein attaching the patterned wafer to the alignment wafer comprises forming a bonding material of at least one of a metallization layer or an adhesive layer on at least one of the patterned wafer or the alignment wafer.

18. The method of claim 13 wherein attaching the patterned wafer to the alignment wafer comprises anodic bonding the patterned substrate to the alignment substrate.

19. The method of claim 13 wherein positioning the plurality of LEDs in the cavities comprises using at least one surface of the cavities as a mechanical stop to guide the LEDs into position on the LED attachment sites.

20. The method of claim 13 wherein the patterned wafer and the alignment wafer have generally similar coefficients of thermal expansion.

21. The method of claim 13 wherein the patterned wafer and the alignment wafer are made from at least one of silicon or glass.

* * * * *